United States Patent [19]
Mountain

[11] Patent Number: 6,013,534
[45] Date of Patent: Jan. 11, 2000

[54] METHOD OF THINNING INTEGRATED CIRCUITS RECEIVED IN DIE FORM

[75] Inventor: David Jerome Mountain, Baltimore, Md.

[73] Assignee: The United States of America as represented by the National Security Agency, Washington, D.C.

[21] Appl. No.: 08/900,869

[22] Filed: Jul. 25, 1997

[51] Int. Cl.[7] .......................... H01L 21/302; H01L 21/463
[52] U.S. Cl. ............................ 438/15; 438/455; 438/458; 438/459; 438/692
[58] Field of Search .............................. 438/15, 107, 691, 438/692, 693, 459, 456, 977, 17, 455

[56] References Cited

U.S. PATENT DOCUMENTS

| | | | |
|---|---|---|---|
| 4,729,971 | 3/1988 | Coleman | 438/462 |
| 4,946,716 | 8/1990 | Corrie | 438/977 |
| 5,071,792 | 12/1991 | Van Vonno et al. | 438/17 |
| 5,256,599 | 10/1993 | Asetta et al. | 437/225 |
| 5,273,940 | 12/1993 | Sanders | 437/209 |
| 5,324,687 | 6/1994 | Wojnarowski | 437/225 |
| 5,348,607 | 9/1994 | Wojnarowski et al. | 156/298 |
| 5,604,160 | 2/1997 | Warfield | 438/458 |
| 5,634,267 | 6/1997 | Farnworth et al. | 324/755 |
| 5,656,552 | 8/1997 | Hudak et al. | 438/15 |
| 5,851,845 | 12/1998 | Wood et al. | 438/977 |
| 5,874,319 | 2/1999 | Dunaway et al. | 438/15 |
| 5,953,588 | 9/1999 | Camien et al. | 438/106 |

*Primary Examiner*—Benjamin Utech
*Assistant Examiner*—Duy-Vu Deo
*Attorney, Agent, or Firm*—Robert D. Morelli

[57] ABSTRACT

A method of thinning integrated circuits in die form including acquiring a handle wafer; depositing an etch stop material on the handle wafer; coating an adhesive layer onto the etch stop material; acquiring a template wafer; cutting an opening through the template wafer; placing dice onto the adhesive layer of the handle wafer; bonding the template wafer onto the handle wafer; filling any gaps with adhesive material; thinning the resulting structure; acquiring a transfer wafer; coating an adhesive layer onto the transfer wafer; bonding the transfer wafer to the resulting structure; removing the handle wafer; removing the etch stop material; removing any remaining adhesive material; testing electrically the thinned dice; recording which of the thinned dice are functional; dicing the transfer wafer into portions; holding temporarily the portions; removing the transfer wafer from the portions; and packaging the thinned dice.

24 Claims, 5 Drawing Sheets

---

| THINNED DICE AND TEMPLATE WAFER |
|---|
| ADHESIVE |
| ETCH STOP |
| HANDLE WAFER |

FIG. 6

| THINNED DICE AND TEMPLATE WAFER |
|---|
| ADHESIVE |
| ETCH STOP |
| HANDLE WAFER |

FIG. 7

| TRANSFER WAFER |
|---|

FIG. 8

| ADHESIVE |
|---|
| TRANSFER WAFER |

FIG. 9

| HANDLE WAFER |
|---|
| ETCH STOP |
| ADHESIVE |
| THINNED DICE AND TEMPLATE WAFER |
| ADHESIVE |
| TRANSFER WAFER |

# METHOD OF THINNING INTEGRATED CIRCUITS RECEIVED IN DIE FORM

FIELD OF THE INVENTION

The present invention relates, in general, to a semiconductor device manufacturing process and, in particular, to a method of thinning semiconductor integrated circuits received in die form.

BACKGROUND OF THE INVENTION

In order to make the cost of manufacturing an integrated circuit as small as possible, many instances of the integrated circuit are fabricated at one time onto a semiconductor wafer. After fabrication, each instance of the integrated circuit is separated from the wafer by sawing the wafer along the boundaries, or scribe lines, between each instance of the integrated circuit. An individual integrated circuit removed from a wafer is commonly referred to as a die. Each die may then be packaged and sold in a standard integrated circuit package (e.g., forty-pin leadless chip carrier) or not packaged at all and sold in die form. A purchaser of an integrated circuit in die form may then package the die in a non-standard package (e.g., a credit-card type package commonly referred to as a smart-card). Also, a purchaser of an integrated circuit in die form may place the die in a package along with another integrated circuit die. A package containing more than one die is commonly referred to as a multi-chip-module (MCM).

Non-standard packages containing a die and multi-chip-modules containing more than one die are becoming very popular because of there compactness and processing power. Manufacturers of such packages are always looking for ways to reduce the size or thickness of such packages. One way of reducing the thickness of such packages is to use die that are as thin as possible.

The minimum thickness required to realize a functional integrated circuit is around five microns. Typically, each integrated circuit fabricated on a wafer is around seven-hundred microns thick. Wafer die are this thick for manufacturing reasons and not for functional reasons. That is, to reduce the cost of an individual integrated circuit, many instances of the integrated circuit are fabricated at once on to a wafer. Wafers are ever increasing in size. The typical wafer today is around eight inches in diameter. In order to handle a wafer of this size without breaking it, the wafer has to be around seven-hundred microns thick.

Many methods exist for thinning a wafer but few methods exist for thinning individual die. U.S. Pat. No. 5,256,599, entitled "SEMICONDUCTOR WAFER WAX MOUNTING AND THINNING PROCESS," discloses a method of thinning an entire wafer. The wafer containing all of the dice fabricated therein is then used in its entirety. The present invention is not a method of thinning a wafer purchased in wafer form from a single manufacturer but a method of thinning individual die that are purchased in die form from any number of die manufacturers. Also, the present invention does not require the use of all of the die thinned by the present invention as a single device as does U.S. Pat. No. 5,256,599. U.S. Pat. No. 5,256,599 is hereby incorporated by reference into the specification of the present invention.

The ability to thin die has benefits over the ability to thin a wafer. Presently, a thinned wafer is used in its entirety. That is, all of the integrated circuits on the wafer are connected as one giant circuit and is packaged as such after it is thinned. The cost of an entire wafer is roughly equivalent to the cost of an individual die times the number of dice on the wafer. If a packager could thin a die then the packager would not be required to purchase thinned wafers and use them in their entirety. Therefore, costs are greatly reduced if individual die could be thinned. Also, a wafer that contains all of the die that a packager wishes to use may be custom to the packager. Custom circuits are, typically, much more expensive than commercially available circuits because custom circuits cannot be manufactured in as great a quantity as can commercially available circuits. Therefore, the ability to thin die would enable a packager to purchase state of the art die at commercial prices, select only those circuits that are required, thin them, and package only those thinned dice that are required.

U.S. Pat. No. 5,273,940, entitled "MULTIPLE CHIP PACKAGE WITH THINNED SEMICONDUCTOR CHIPS," discloses a method of electrically connecting standard thickness dice in a multi-chip-module, encapsulating the dice, and thinning the encapsulant and the dice. In this method, the dice are required to be electrically connected as a multi-chip-module prior to dice thinning. The manufacturing yield of the multi-chip-module can be no better than the dice thinning yield. Many good die would go to waste using this method because one bad die ruins the entire multi-chip-module. Presently, there is no way to do repairs at the multi-chip-module level. It is more cost effective to detect and correct a problem at the earliest point in the manufacturing process. The present invention is a method of thinning dice and testing them prior to electrically connecting them into a multi-chip-module. Therefore, the multi-chip-module yield is, theoretically, one-hundred percent using the present invention. U.S. Pat. No. 5,273,940 is hereby incorporated by reference into the specification of the present invention.

U.S. Pat. No. 5,324,687, entitled "METHOD FOR THINNING OF INTEGRATED CIRCUIT CHIPS FOR LIGHTWEIGHT PACKAGED ELECTRONIC SYSTEMS," discloses a method of placing standard thickness dice circuit-side up in various wells in a semiconductor wafer. Each well has to be custom formed to accommodate the die placed therein. An adhesive layer in then placed over the face of each die. The adhesive is then bonded to a holding device. The semiconductor and, therefore, the dice are thinned from the backside of the dice to a desired thickness. The thinned dice and parts of the semiconductor wafer remaining between the dice may then be removed from the holding device and used in a multi-chip-module. In this method the semiconductor wafer must be customized to accept a certain set of dice. That is, the well sizes are determined by the dice used. If the size or thickness of the dice used changes then new wells must be formed into the wafer used to hold the dice to be thinned. Such customization is much more expensive as compared to a method that may be used for dice of any size or thickness such as the method of the present invention. U.S. Pat. No. 5,324,687 is hereby incorporated by reference into the specification of the present invention.

SUMMARY OF THE INVENTION

It is an object of the present invention to thin semiconductor integrated circuits received in die form.

It is another object of the present invention to thin semiconductor integrated circuits received in die form of various types without any size or thickness restriction.

It is another object of the present invention to thin semiconductor integrated circuits received in die form of various types without any size or thickness restriction so that the thinned dice may be used individually.

It is another object of the present invention to thin semiconductor integrated circuits received in die form of various types without any size or thickness restriction so that all or a portion of the thinned dice may be used together in a multi-chip-module.

The present invention is a method of thinning semiconductor integrated circuits received in die form.

The first step of the method is to acquire a semiconductor wafer, hereinafter referred to as a handle wafer, that may hold all of the dice that a user wishes to thin.

Next, a material that is suitable as an etch stop is deposited on the handle wafer.

Next, a second semiconductor wafer, hereinafter referred to as a template wafer, is obtained.

Next, an opening is cut through the template wafer that is large enough to accommodate the dice to be thinned.

Next, an adhesive layer is coated onto the etch stop material on the handle wafer.

Next, functional dice to be thinned are placed circuit-side, or face-side, down onto the adhesive layer on the handle wafer in an area defined by the intersection of the handle wafer and the opening cut into the template wafer when the handle wafer and the template wafer are aligned on top of each other.

Next, if there would be any additional space between the functional dice and the inside edge of the opening in the template wafer if the template wafer were placed over the handle wafer then at least one non-functional semiconductor piece would be placed in that space.

Next, the template wafer is bonded to the handle wafer so that the functional dice and any non-function semiconductor pieces are contained within the opening cut in the template wafer. In an alternate embodiment, sections of a semiconductor wafer may be used to mimic the structure represented by the cut template wafer.

Next, the non-circuit side, or backside, of the functional dice and any non-functional pieces are coated with an adhesive material in order to fill, or partially fill, any spaces between the dice, pieces, and template wafer.

Next, if the backside of the functional dice is not sufficiently planar then a layer of wax is deposited over the adhesive coated functional dice area in order to achieve sufficient planarity.

Next, the functional dice are thinned from the backside area of the function dice to a die thickness in the range of from five microns to one-hundred microns using conventional thinning techniques.

Next, if any wax remains on the backside area of the thinned functional dice then the wax is removed using conventional techniques for removing wax from a semiconductor material.

Next, a third semiconductor wafer, hereinafter referred to as a transfer wafer, is obtained that is the same size as the template wafer.

Next, the transfer wafer is coated with an adhesive material.

Next, the backside area of the thinned functional dice is bonded to the adhesive layer on the transfer wafer.

Next, the handle wafer is removed down to the etch stop material contained therein using conventional semiconductor material removal techniques.

Next, the etch stop material is removed using conventional etch stop material removal techniques.

Next, the adhesive on the face-side area of the thinned functional dice is removed using conventional adhesive removal techniques.

Next, the thinned functional dice are electrically tested to see which dice are still functional and which dice are not.

Next, the position of each die that is still functional is recorded.

Next, the transfer wafer is diced into functional units according to a user-definable dice pattern. That is, a user may wish to dice the transfer wafer in order to receive individual die or sections containing multiple die.

Next, each diced portion of the transfer wafer is held temporarily by conventional methods for holding semiconductor material temporarily.

Next, the piece of transfer wafer attached to the diced portion is removed using conventional semiconductor material removal techniques.

Finally, the thinned diced sections are packaged into electrical packages or non-electrical packages.

DETAILED DESCRIPTION

The present invention is a method of thinning semiconductor integrated circuits received in die form.

Figure 1:
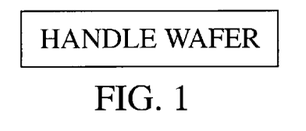
FIG. 1 is a side view of the handle wafer.

The first step of the method is to acquire a semiconductor wafer, hereinafter referred to as a handle wafer, that can hold all of the dice that a user wishes to thin. FIG. 1 is a side view of the handle wafer. FIG. 1, as well as the other figures of the present invention, are not to scale. In the preferred embodiment, the handle wafer is 150 millimeters diameter, but any other suitable diameter will suffice. Note that the handle wafer is not customized for any particular die to be thinned as is the handle wafer in some prior art die thinning methods.

Figure 2:
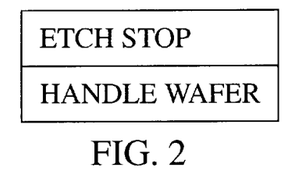
FIG. 2 is a side view of the handle wafer with an etch stop material deposited thereon.

Next, a material that is suitable as an etch stop is deposited on the handle wafer. The etch stop material may be selected from the group consisting of silicon dioxide, silicon nitride, metal, polymer, silicon carbide, and bisbenzocyclobutene resin (BCB). The etch stop material may be deposited using any conventional semiconductor deposition technique. FIG. 2 is a side view of the handle wafer with an etch stop deposited thereon.

Next, a second semiconductor wafer, hereinafter referred to as a template wafer, is obtained. In the preferred embodiment, the template wafer should be the same diameter as the handle wafer (e.g., 150 mm).

Figure 3:
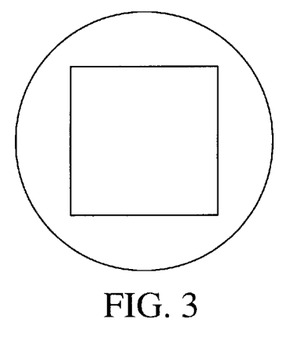
FIG. 3 is a side view of the template wafer with a window cut therein.

Next, at least one window is to cut into, and through, the template wafer. FIG. 3 is a top view of the template wafer with a square hole cut into, and through, the template wafer. The present invention is not limited to a square hole and any suitable shape (e.g., circle, rectangle, etc.) may be cut into the template wafer that is large enough to accommodate the dice to be thinned. In an alternate embodiment, the hole may be extended to the point that the template wafer is not one piece but four segments (e.g., four orange-slice shaped pieces). As will be described below in more detail, the hole in the template wafer defines the space into which dice to be thinned will be placed. Note that the hole cut into the template wafer is not required to be customized for the particular dice to be thinned. One size hole will accommodate dice of varying sizes. If a user wishes to thin only a certain number of dice then the user may pre-fabricate a template wafer with a smaller hole. A number of template wafers may be pre-fabricated into a number of templates where each template has a different size hole to accommodate some area of dice. Again, none of these templates are customized to the size of a particular die to be thinned, but are sized according to a particular quantity of dice to be thinned.

Figure 4:
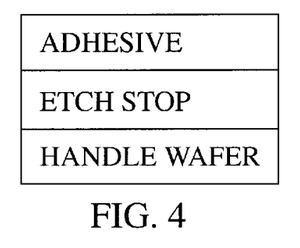
FIG. 4 is a side view of the handle wafer with an adhesive layer deposited on the etch stop material.

Next, an adhesive layer is deposited on the etch stop material on the handle wafer. The adhesive material may be selected from the group consisting of epoxy, wax, BCB, and acrylic. Any other suitable material may be used. The adhesive layer may be deposited using any adhesive deposition technique that is suitable for a semiconductor. FIG. 4 is a side view of the handle wafer with an adhesive layer deposited thereon.

Figure 5:
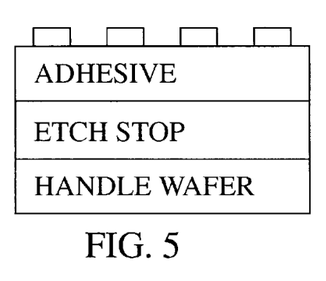
FIG. 5 is a side view of the handle wafer with functional dice attached to the adhesive layer.
Figure 6:
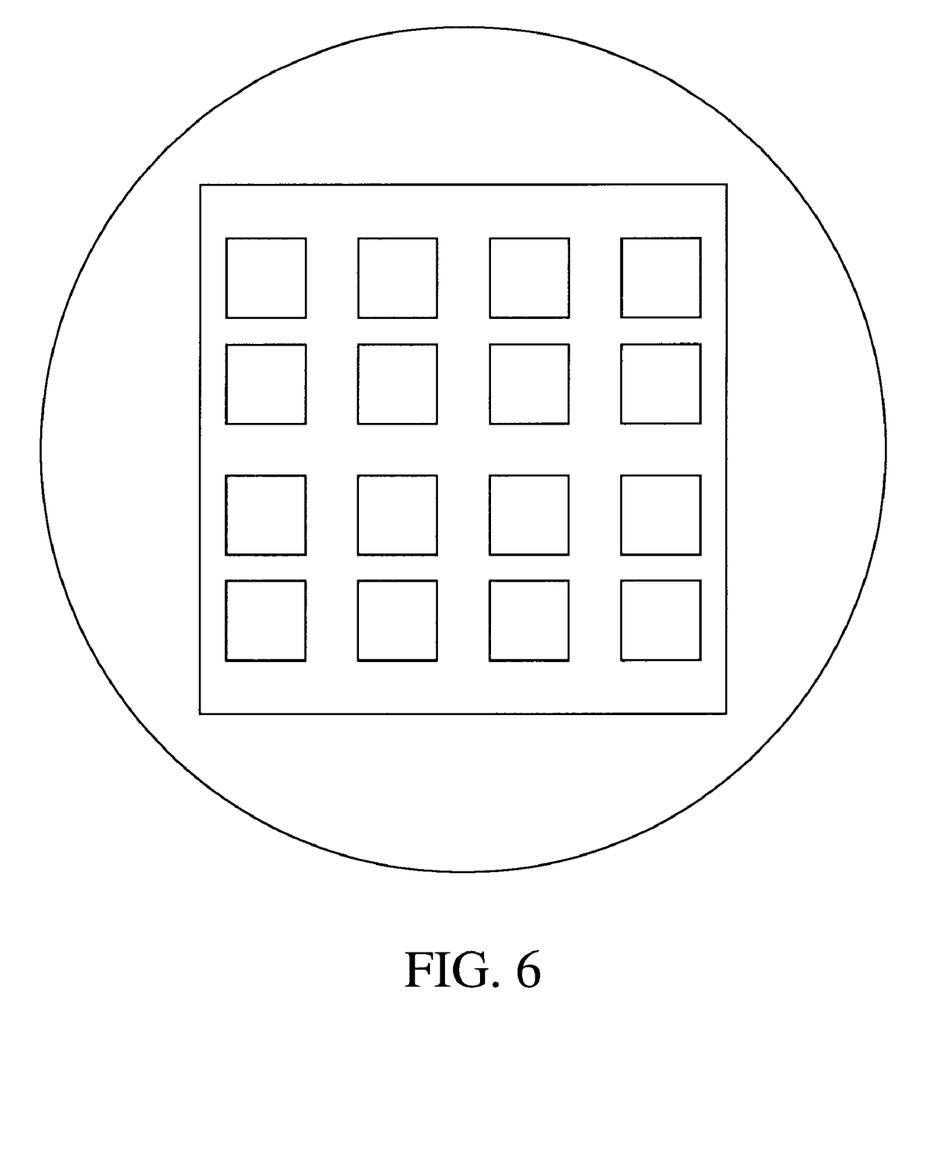
FIG. 6 is a side view of the handle wafer with the first transfer wafer bonded thereto so that the dice are within the window of the template wafer.

Next, functional dice to be thinned are placed circuit-side, or face-side, down onto the adhesive layer on the handle wafer in an area defined by the intersection of the handle wafer and the window cut into the template wafer if the handle wafer and the template wafer were aligned one on top of the other. FIG. 5 is a side view of dice to be thinned placed on the adhesive layer of the handle wafer. Again, the figures of the present invention are not to scale. The dice may be place in any fashion or they may be placed in registered fashion so that the thinned dice may then be transferred directly to a package were the dice must be in a particular configuration. The functional dice to be thinned may occupy the entire area defined by the hole in the template wafer or a space may be left between the function dice and the inside edge defined by the intersection of the handle wafer and the template wafer. If a space is left then pieces of semiconductor material (e.g., non-functional dice) may be placed in these spaces in order to minimize the space between adjacent semiconductor materials. This become more clear after the description of the next step. By minimizing the space between semiconductor materials, the amount of chipping of the edges of dice near these spaces that may occur during the thinning process is minimized.

Next, the template wafer is bonded to the handle wafer so that the functional dice and any non-functional semiconductor pieces are contained within the window cut into the template wafer. As mentioned above as an alternate embodiment, sections of a semiconductor wafer may be used to mimic the structure represented by the cut template wafer. FIG. 5 is a top view of the template wafer placed over the handle wafer so that the functional dice and any non-functional semiconductor pieces are retained within the hole cut into the template wafer.

Next, the non-circuit side, or backside, of the functional dice and any non-functional semiconductor pieces are coated with an adhesive in order to fill, or partially fill, any spaces between the dice, the semiconductor pieces, and the template wafer. The adhesive material is selected from the same group of materials used above for the adhesive layer on the handle wafer. By filling the gaps with adhesive, a more rigid structure is obtained that can better withstand the forces placed thereon by the thinning process. This step is not depicted in a figure.

Next, if the backside of the functional dice, any semiconductor pieces, and the template wafer is not sufficiently planar then a layer of wax is deposited thereon to achieve sufficient planarity. This step is not depicted in a figure.

Figure 7:
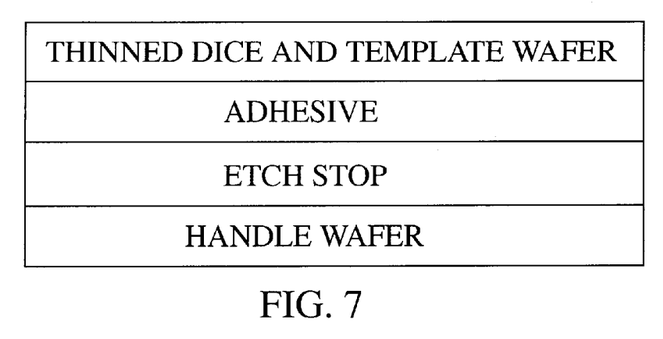
FIG. 7 is a side view of the handle wafer after the dice and the template wafer are thinned.

Next, the functional dice, any semiconductor pieces, and the template wafer are thinned from the backside area of the functional dice to a thickness in the range of from 5 microns to 100 microns. Conventional die or wafer thinning techniques may be used. That is, chemical etch, mechanical grinding, or a combination of the two may be used. Any other suitable semiconductor thinning technique may be used. FIG. 7 is a side view of the thinned structure containing the functional dice.

Next, if any wax remains on the backside area of the thinned functional dice structure then the wax is removed using any conventional wax removal technique that is suitable for a semiconductor material. This step is not depicted in a figure.

Figure 8:
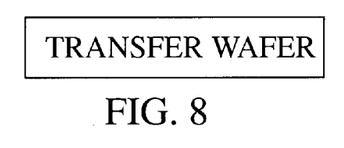
FIG. 8 is a side view of a transfer wafer.

Next, a third semiconductor, hereinafter referred to as a transfer wafer, is obtained. The transfer wafer must be large enough to accept the area of functional dice thinned, but is preferred to be the same size as the template wafer (e.g., 150 mm in diameter). Note that there is nothing custom about the transfer wafer. FIG. 8 is a side view of the transfer wafer.

Figure 9:
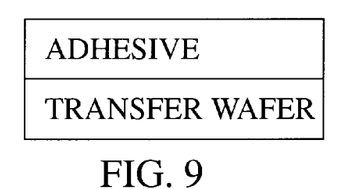
FIG. 9 is a side view of the transfer wafer with an adhesive layer deposited thereon.

Next, the transfer wafer is coated with an adhesive material. The adhesive material is selected from the same group as was the adhesive material that was deposited on the handle wafer. The adhesive material may be deposited on the transfer wafer using convention adhesive deposition techniques that are suitable for a semiconductor. FIG. 9 is a side view of the transfer wafer with an adhesive layer deposited thereon.

Figure 10:
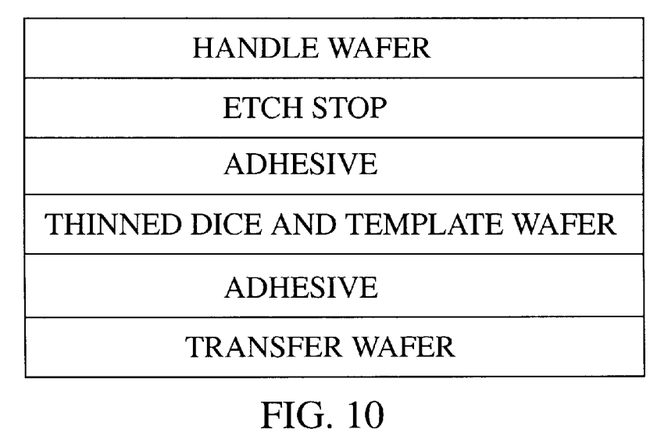
FIG. 10 is a side view of the transfer wafer with the thinned dice and handle wafer bonded thereto.

Next, the backside area of the thinned functional dice structure is bonded to the adhesive layer of the transfer wafer. Any conventional bonding technique suitable for a semiconductor may be used. FIG. 10 is a side view of the transfer wafer bonded to the thinned functional dice structure.

Figure 11:
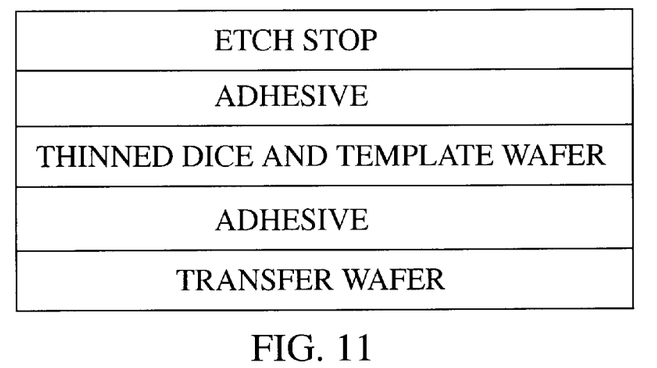
FIG. 11 is a side view of the transfer wafer with the handle wafer removed down to its etch stop.

Next, the handle wafer is removed down to the etch stop material contained thereon. Any conventional semiconductor material removal technique may be used (e.g., chemical, mechanical, a combination of the two, etc.). FIG. 11 is a side view of the thinned functional dice structure with the handle wafer removed down to its etch stop.

Figure 12:
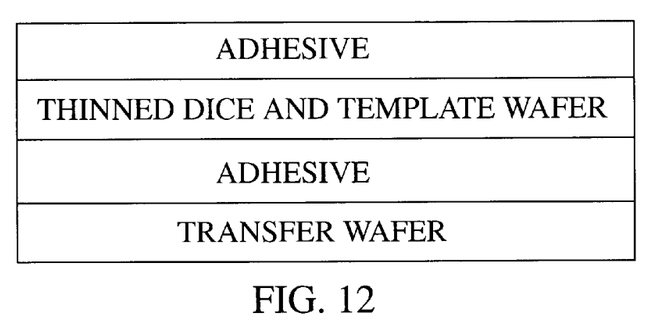
FIG. 12 is a side view of the transfer wafer with the etch stop of the handle wafer removed.

Next, the etch stop material is removed using conventional etch stop material removal techniques (e.g., chemical processing). FIG. 12 is a side view of the thinned functional dice structure with the etch stop removed.

Figure 13:
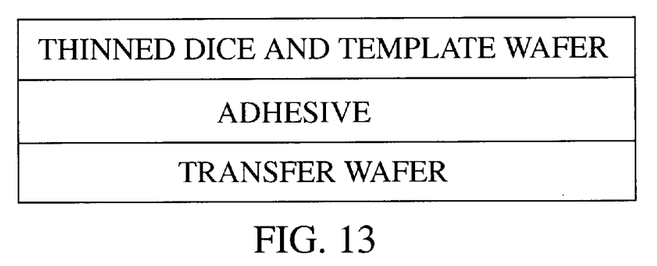
FIG. 13 is a side view of the transfer wafer with the adhesive layer deposited on the handle wafer removed.

Next, any adhesive material remaining on the face-side area of the thinned functional dice structure is removed using conventional adhesive removal techniques suitable for a semiconductor. FIG. 13 is a side view of the thinned functional dice structure with the adhesive layer, which was deposited on the handle wafer, removed.

Next, each thinned die is electrically tested to see which dice are still functional after the thinning process and which dice are not. By testing each die after the thinning process and before packaging, a packaging yield approaching one-hundred percent is possible. Otherwise, the packaging yield would be the same as the yield of the thinning process. This step is not depicted in a figure.

Next, the position of each die that is still functional after the thinning process is recorded. This step enables the user to know which thinned functional dice are good and which ones are not. This step is not depicted in a figure.

Figure 14:
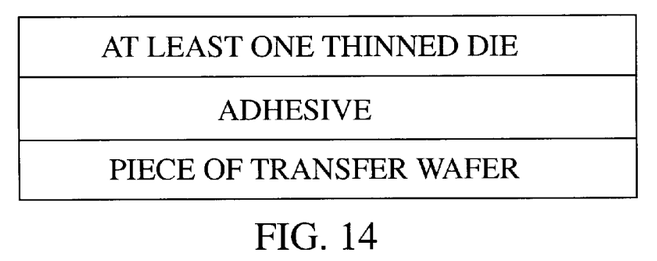
FIG. 14 is a side view of a section diced from the second transfer wafer.

Next, the transfer wafer is diced into functional units according to a user-definable dice pattern. That is, a user may wish to dice the transfer wafer in order to receive individual die or sections containing multiple die. The multiple die may be used in a multi-chip-module. Any conventional dicing techniques suitable for a semiconductor may be used. FIG. 14 is a side view of the result of dicing the transfer wafer.

At this point, there are two packaging options available. The first packaging option is to package the diced functional unit, while still attached to the piece of transfer wafer, in an electronic package. If this option is taken, the piece of transfer wafer may then either be released from, or left attached to, the diced functional unit. If the piece of the transfer wafer is to be released then any suitable semiconductor material release technique may be used. The second packaging option is to release the piece of transfer wafer attached to the diced functional unit prior to packaging the diced functional unit in an electronic package. The second packaging option is described below in more detail.

Figure 15:
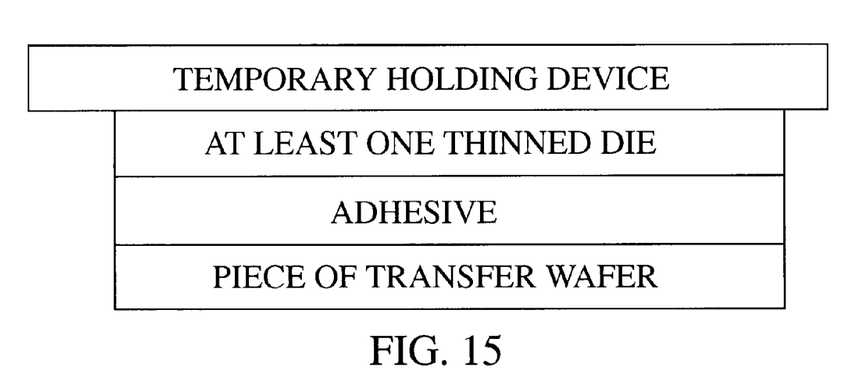
FIG. 15 is a side view of the section diced from the second transfer wafer as it is being held by a temporary holding mechanism.

Each diced portion of the transfer wafer is held temporarily by conventional methods for holding semiconductor material temporarily. For example, the diced portion of the transfer wafer may be held temporarily by a vacuum tweezers, dicing tape, a gel material, or any other suitable holding method. One type of suitable gel material is commercially available under the brand-name Gel-Pak. FIG. 15 is a side view of the portion of the transfer wafer being held by a temporary holding mechanism.

Figure 16:
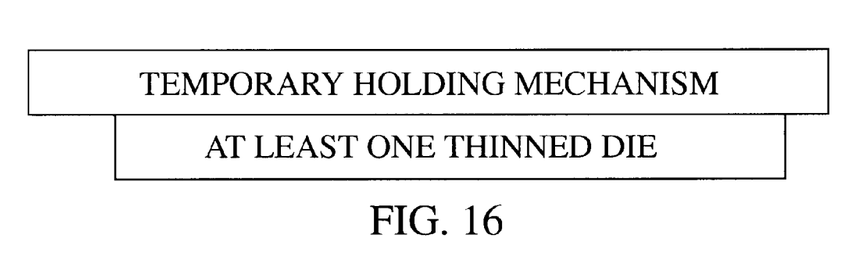
FIG. 16 is a side view of the temporary holding mechanism with the piece of the transfer wafer and the adhesive layer deposited thereon removed.

Next, the piece of transfer wafer attached to the diced portion is released using any suitable semiconductor material release technique (e.g., chemical process). FIG. 16 is a side view of the diced portion being held by a temporary holding mechanism with the piece of transfer wafer released.

Figure 17:
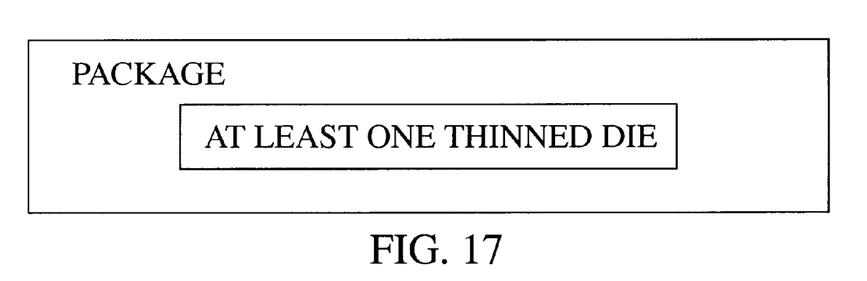
FIG. 17 is a side view of a package containing at least one thinned die thinned by the method of the present invention.

Finally, the thinned diced sections are packaged as the user desires. Again, each thinned diced section may consist of an individual die or multiple dice. The package may be an electrical package for receiving the thinned diced portion into the intended end product (e.g., smart-card, multi-chip-module, etc.) or it may be a non-electrical package for holding one or more thinned diced portions for storage so that the thinned diced portions may be placed into an electrical package at a later date. FIG. 17 is a side view of a thinned diced portion in some sort of a package.

In an alternate embodiment of the present invention, a handle wafer having a well, and having a planarized etch stop material outside the well is used in place of the above-described handle wafer and template wafer. The functional dice and any semiconductor pieces would then be placed inside the well. The dice are then thinned and tested. The resulting structure would then be placed on the transfer wafer as described above. The rest of the steps of the alternate method would be as in the preferred method described above. The alternate method may provide better planarity, but the preferred method described above is simpler and provides more options.

What is claimed is:

1. A method of thinning integrated circuits in die form, comprising the steps of:

a) acquiring a handle wafer;

b) depositing an etch stop material on the handle wafer;

c) coating an adhesive layer onto the etch stop material;

d) acquiring a template wafer;

e) cutting at least one opening through the template wafer, where the opening is large enough to accommodate at least one die;

f) placing the at least one die circuit-side down onto the adhesive layer of the handle wafer in an area that constitutes an intersection between the handle wafer and the at least one opening in the template wafer;

g) bonding the template wafer onto the handle wafer so that the at least one die is contained within the at least one opening of the template wafer;

h) filling at least partially with adhesive material any gaps created by the at least one die and the template wafer;

i) thinning the result of step (h) from the non-circuit side of the at least one die to a die thinness in the range of from five microns to one-hundred microns;

j) acquiring a transfer wafer;

k) coating an adhesive layer onto the transfer wafer;

l) bonding the result of step (i) to the result of step (k) so that the non-circuit side of the thinned at least one die is attached to the adhesive layer of the transfer wafer;

m) removing the handle wafer from the result of step (l) down to the etch stop material contained thereon;

n) removing the etch stop material from the result of step (m);

o) removing any adhesive material remaining on the circuit-side of the thinned at least one die after step (n);

p) testing electrically the thinned at least one die to determine which are functional after step (i);

q) recording which of the thinned at least one die are functional after step (p);

r) dicing the transfer wafer into at least one portion containing at least one thinned die; and s) holding the at least one portion containing at least one thinned die.

2. The method of claim 1, further comprising the steps of:

a) releasing the transfer wafer from the at least one portion containing at least one thinned die; and b) packaging the at least one thinned die.

3. The method of claim 2, wherein said steps of acquiring a handle wafer, acquiring a template wafer, and acquiring a transfer wafer are each comprised of the step of acquiring a semiconductor wafer that is 150 mm in diameter.

4. The method of claim 3, wherein said step of depositing an etch stop material is comprised of the step of depositing an etch stop material selected from the group consisting of silicon dioxide, silicon nitride, metal, polymer, silicon carbide, and bisbenzocyclobutene resin.

5. The method of claim 4, wherein each said steps of coating an adhesive layer onto the handle wafer, coating an adhesive layer onto the transfer wafer, and filling at least partially with adhesive material any gaps are each comprised of doing said step using adhesive material selected from the group consisting of epoxy, wax, bisbenzocyclobutene resin, and acrylic.

6. The method of claim 5, further comprising the step of placing pieces of semiconductor material between the at least one die and an inside edge of the template wafer.

7. The method of claim 6, wherein said steps of thinning the result of step (h), removing the handle wafer, removing the etch stop, removing the adhesive material, and removing the transfer wafer are each comprised of doing said step using a removal technique selected from the group consisting of mechanical grinding, chemical etching, and a combination of mechanical grinding and chemical etching.

8. The method of claim 7, wherein said step of holding temporarily the at least one portion is comprised of the step of holding temporarily the at least one portion using a holding technique selected from the group consisting of vacuum tweezers, dicing tape, and gel material.

9. The method of claim 8, further comprising the step of coating with wax to sufficiently planarize the backside of the at least one die after filling at least partially with adhesive any gaps.

10. The method of claim 9, further comprising the step of removing any wax after thinning the result of step (i).

11. The method of claim 10, wherein said step of packaging is comprised of the step of packaging in a package selected from the group consisting of an electrical package and a non-electrical package.

12. The method of claim 11, wherein said step of dicing the transfer wafer into at least one portion is comprised of the step of dicing the transfer wafer into at least one portion where each of said at least one portion consists of one die.

13. The method of claim 12, wherein said step of dicing the transfer wafer into at least one portion is comprised of the step of dicing the transfer wafer into at least one portion where each of said at least one portion consists of multiple die.

14. The method of claim 2, wherein said step of depositing an etch stop material is comprised of the step of depositing an etch stop material selected from the group consisting of silicon dioxide, silicon nitride, metal, polymer, silicon carbide, and bisbenzocyclobutene resin.

15. The method of claim 2, wherein each said steps of coating an adhesive layer onto the handle wafer, coating an adhesive layer onto the transfer wafer, and filling at least partially with adhesive material any gaps are each comprised of doing said step using adhesive material selected from the group consisting of epoxy, wax, bisbenzocyclobutene resin, and acrylic.

16. The method of claim 2, further comprising the step of placing pieces of semiconductor material between the at least one die and an inside edge of the template wafer.

17. The method of claim 2, wherein said steps of thinning the result of step (h), removing the handle wafer, removing the etch stop, removing the adhesive material, and removing the transfer wafer are each comprised of doing said step using a removal technique selected from the group consisting of mechanical grinding, chemical etching, and a combination of mechanical grinding and chemical etching.

18. The method of claim 2, wherein said step of holding temporarily the at least one portion is comprised of the step of holding temporarily the at least one portion using a holding technique selected from the group consisting of vacuum tweezers, dicing tape, and gel material.

19. The method of claim 2, further comprising the step of coating with wax to sufficiently planarize the backside of the at least one die after filling at least partially with adhesive any gaps.

20. The method of claim 2, further comprising the step of removing any wax after thinning the result of step (i).

21. The method of claim 2, wherein said step of packaging is comprised of the step of packaging in a package selected from the group consisting of an electrical package and a non-electrical package.

22. The method of claim 2, wherein said step of dicing the transfer wafer into at least one portion is comprised of the step of dicing the transfer wafer into at least one portion where each of said at least one portion consists of one die.

23. The method of claim 2, wherein said step of dicing the transfer wafer into at least one portion is comprised of the step of dicing the transfer wafer into at least one portion where each of said at least one portion consists of multiple die.

24. The method of claim 1, further comprising the steps of:

a) packaging the at least one portion containing at least one thinned die; and b) releasing the transfer wafer from the packaged at least one portion containing at least one thinned die.

* * * * *